US008188561B2

United States Patent
Higashi et al.

(10) Patent No.: US 8,188,561 B2
(45) Date of Patent: May 29, 2012

(54) INTEGRAL TOPSIDE VACUUM PACKAGE

(75) Inventors: Robert E. Higashi, Shorewood, MN (US); Karen M. Newstrom-Peitso, Hopkins, MN (US); Jeffrey A. Ridley, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/958,161

(22) Filed: Dec. 1, 2010

(65) Prior Publication Data

US 2011/0070401 A1    Mar. 24, 2011

Related U.S. Application Data

(60) Division of application No. 11/832,473, filed on Aug. 1, 2007, now Pat. No. 7,875,944, which is a division of application No. 10/750,580, filed on Dec. 29, 2003, now Pat. No. 7,276,798, which is a continuation-in-part of application No. 10/154,577, filed on May 23, 2002, now Pat. No. 7,071,566.

(51) Int. Cl.
*H01L 31/0203* (2006.01)
(52) U.S. Cl. ........ 257/434; 257/433; 257/437; 257/737; 257/703
(58) Field of Classification Search .................. 257/434, 257/433, 437, 777, 703, 704, 737
See application file for complete search history.

(56) References Cited

U.S. PATENT DOCUMENTS

| | | | |
|---|---|---|---|
| 4,001,586 A | 1/1977 | Fraioli | |
| 4,536,608 A | 8/1985 | Sheng et al. | |
| 4,614,961 A | 9/1986 | Khan et al. | |
| 4,870,224 A | 9/1989 | Smith et al. | |
| 5,146,465 A | 9/1992 | Khan et al. | |
| 5,278,435 A | 1/1994 | Van Hove et al. | |
| 5,468,910 A | 11/1995 | Knapp et al. | |
| 5,512,750 A | 4/1996 | Yanka et al. | |

(Continued)

FOREIGN PATENT DOCUMENTS
EP    0177918    3/1991
(Continued)

OTHER PUBLICATIONS

Brown, et al., "Visible-Blind UV Digital Camera Based on a 32*32 Array of GAN/AlGAN P-I-N Photodiodes", MRS Internet Journal of Nitride Semiconductor Research, vol. 4S1, pp. 1-10, Sep. 1999.

(Continued)

*Primary Examiner* — Thinh T Nguyen
(74) *Attorney, Agent, or Firm* — Seager, Tufte & Wickhem LLC

(57) ABSTRACT

An integrated vacuum package having an added volume on a perimeter within the perimeter of a bonding seal between two wafers. The added volume of space may be an etching of material from the inside surface of the top wafer. This wafer may have vent holes that may be sealed to maintain a vacuum within the volume between the two wafers after the pump out of gas and air. The inside surface of the top wafer may have an anti-reflective pattern. Also, an anti-reflective pattern may be on the outside surface of the top wafer. The seal between the two wafers may be ring-like and have a spacer material. Also, it may have a malleable material such as solder to compensate for any flatness variation between the two facing surfaces of the wafers.

6 Claims, 5 Drawing Sheets

U.S. PATENT DOCUMENTS

| | | | |
|---|---|---|---|
| 5,550,373 | A | 8/1996 | Cole et al. |
| 5,677,538 | A | 10/1997 | Moustakas et al. |
| 5,679,965 | A | 10/1997 | Schetzina |
| 5,701,008 | A * | 12/1997 | Ray et al. .................. 250/352 |
| 5,723,706 | A | 3/1998 | Brasier et al. |
| 5,739,554 | A | 4/1998 | Edmond et al. |
| 5,834,331 | A | 11/1998 | Razeghi |
| 5,847,397 | A | 12/1998 | Moustakas |
| 5,869,896 | A | 2/1999 | Baker et al. |
| 5,895,233 | A * | 4/1999 | Higashi et al. ............. 438/107 |
| 5,900,650 | A | 5/1999 | Nitta |
| 6,036,872 | A | 3/2000 | Wood et al. |
| 6,080,988 | A | 6/2000 | Ishizuya et al. |
| 6,252,229 | B1 | 6/2001 | Hays et al. |
| 6,266,197 | B1 | 7/2001 | Glenn et al. |
| 6,287,940 | B1 | 9/2001 | Cole et al. |
| 6,296,779 | B1 | 10/2001 | Clark et al. |
| 6,324,192 | B1 | 11/2001 | Tayebati |
| 6,335,669 | B1 | 1/2002 | Miyazaki et al. |
| 6,359,333 | B1 | 3/2002 | Wood et al. |
| 6,404,648 | B1 | 6/2002 | Slupe et al. |
| 6,438,149 | B1 | 8/2002 | Tayebati et al. |
| 6,483,130 | B1 | 11/2002 | Yang et al. |
| 6,492,726 | B1 | 12/2002 | Quek et al. |
| 6,507,107 | B2 | 1/2003 | Vaiyapuri |
| 6,597,713 | B2 | 7/2003 | Ouchi |
| 6,627,892 | B2 | 9/2003 | Cole |
| 6,627,983 | B2 | 9/2003 | Tu et al. |
| 6,686,653 | B2 | 2/2004 | Jerominek et al. |
| 6,897,469 | B2 * | 5/2005 | Syllaios et al. ............... 257/10 |
| 7,015,457 | B2 | 3/2006 | Cole et al. |
| 7,071,566 | B2 | 7/2006 | Cole et al. |
| 7,077,969 | B2 | 7/2006 | Jerominek et al. |
| 7,145,721 | B2 | 12/2006 | Banish et al. |
| 7,276,798 | B2 | 10/2007 | Higashi et al. |
| 2008/0017944 | A1 | 1/2008 | Higashi et al. |

FOREIGN PATENT DOCUMENTS

| | | |
|---|---|---|
| EP | 0667548 | 1/1995 |
| JP | 03252172 | 11/1991 |
| JP | 05-095130 | 4/1993 |
| JP | 7288334 | 10/1995 |
| JP | 2000337959 | 12/2000 |
| WO | 9326049 | 12/1993 |

OTHER PUBLICATIONS

Chitica et al., "Monolithic InP-Based Tunable Filter with 10-nm Bandwidth for Optical Data Interconnects in the 1550-nm Band," IEEE Photonics Technology Letters, vol. 11, No. 5, pp. 584-586, May 1999.

Chung et al., "Design and Fabrication of 10×10 Micro-Spatial Light Modulator Array for Phase and Amplitude Modulation," Sensors and Actuators, vol. 78, No. 1, pp. 63-70, Jan. 1999.

Jerman et al., "A Miniature Fabry-Perot Interferometer with a Corrugated Silicon Diaphragm Support," Sensors and Actuators, vol. A29, No. 2, pp. 151-158, Nov. 1991.

Cole et al., "Microscopic Spectroscopy of Optical MEMS Devices," Topic 2 (Materials and Technology), Honeywell Laboratories, 2 pages, on or Around Dec. 11, 2000.

Motamedi et al., "Antireflection Surfaces in Silicon Using Binary Optics Technology," Applied Optics, vol. 31, No. 2, pp. 4371-4376, Aug. 1, 1002.

Sze, "Physics of Semiconductor Devices." pp. 763-765, John Wiley & Sons, N.Y., 1982.

Tayebati et al., "Microelectromechanical Tunable Filter with Stable Half Symmetric Cavity," Electronics Letters, IEE Stevanage, GB, vol. 34, No. 20, pp. 1967-1968, Oct. 1998.

Tayebati et. al., "Widely Tunable Fabry-Perot Filters Using High Index-Contrast DBRs," Design and Manufacturing of WDM Devices, Dallas, Texas, Nov. 4-5, 1997, SPIE vol. 3234, pp. 206-218, 1998.

Yang et al., "Back-Illuminated GAN/AlGAN Heterojunction Photodiodes With High Quantum Efficiency and Low Noise," Applied Physics Letters, vol. 73, No. 8, pp. 1086-1088, XP000777678, Aug. 24, 1998.

* cited by examiner

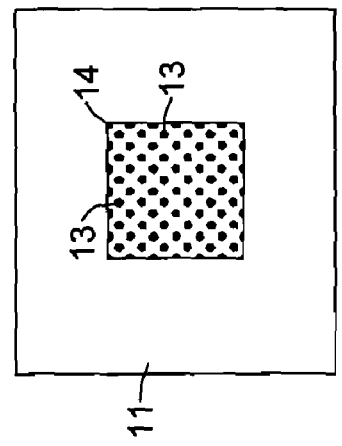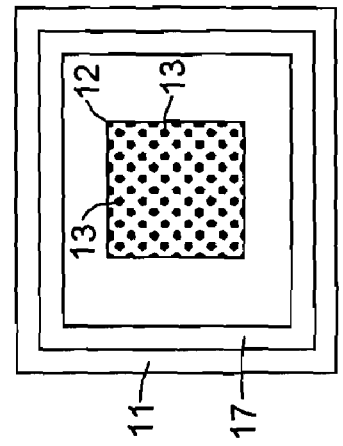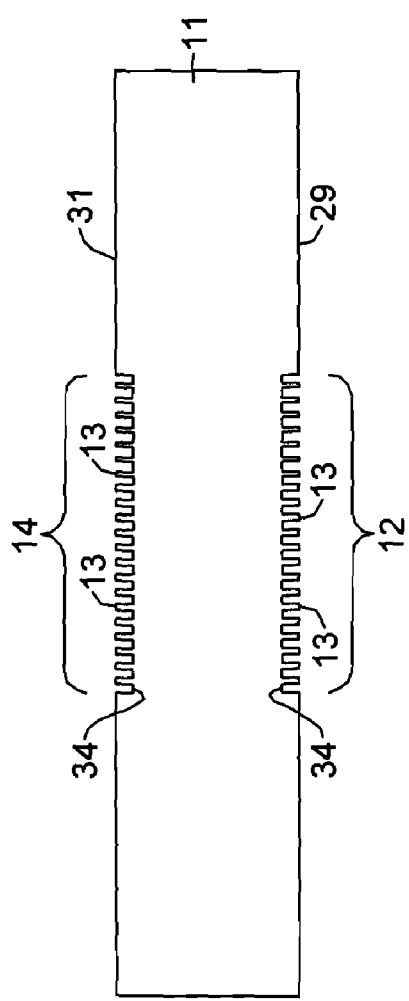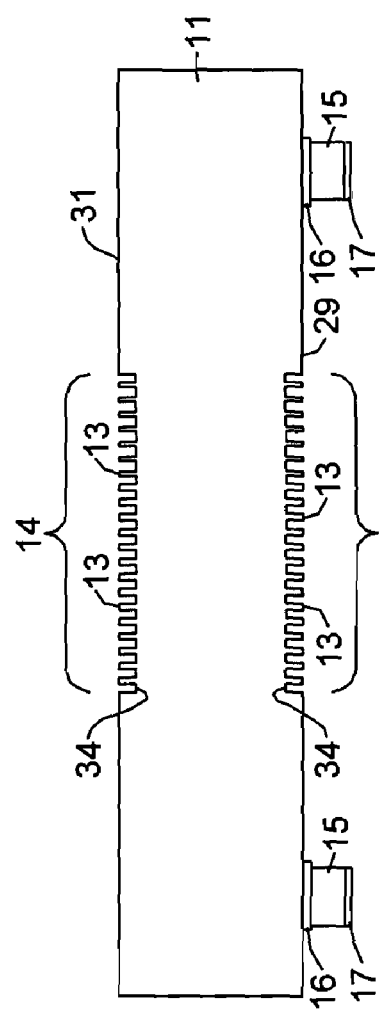

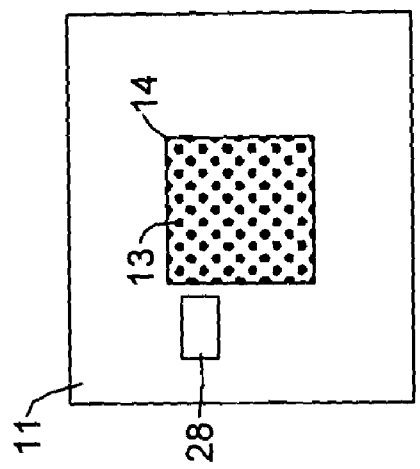
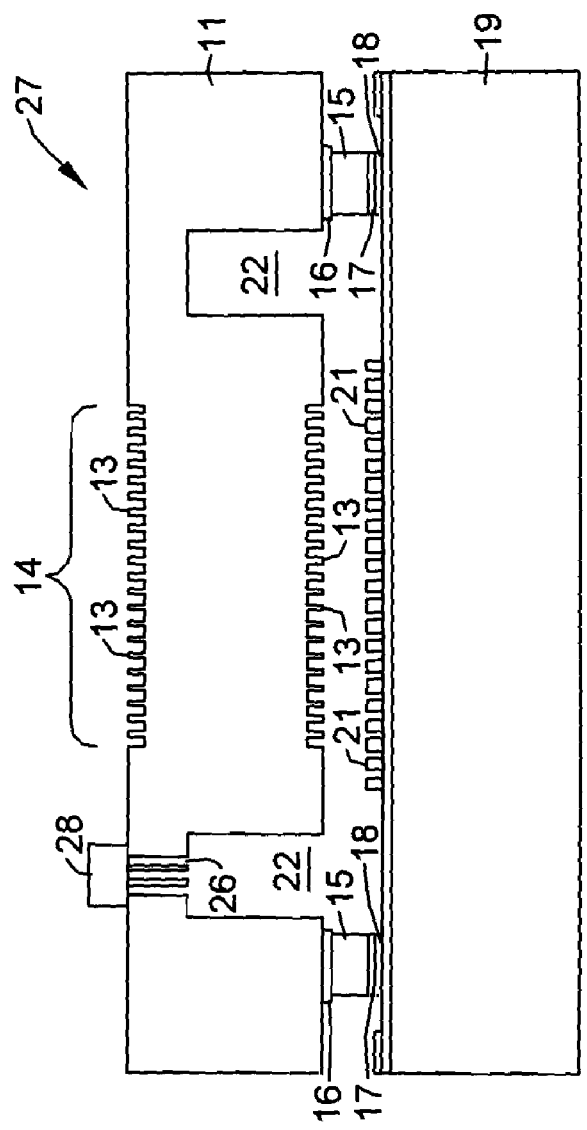
Figure 7A
Figure 7B

US 8,188,561 B2

INTEGRAL TOPSIDE VACUUM PACKAGE

The present application is a Divisional of U.S. patent application Ser. No. 11/832,473, filed Aug. 1, 2007, which is a Divisional of U.S. patent application Ser. No. 10/750,580, filed Dec. 29, 2003, now U.S. Pat. No. 7,276,798, issued Oct. 2, 2007, which is a Continuation-in-Part of U.S. patent application Ser. No. 10/154,577, filed on May 23, 2002, now U.S. Pat. No. 7,071,566, issued Jul. 4, 2006, all of which are hereby incorporated by reference.

BACKGROUND

The invention relates to sealed vacuum packages and particularly to wafer pairs sealed having sealed chambers. More particularly, the invention relates to such packages having wafer topcaps.

Several patent documents may be related to sealed wafer pair chambers integrated vacuum packages. One patent document is U.S. Pat. No. 5,895,233, issued Apr. 20, 1999, to R. Higashi et al., and entitled "Integrated Silicon Micropackage for Infrared Devices," which is hereby incorporated by reference in the present specification. The assignee of this patent is the same assignee of the present invention. Another patent document is U.S. Pat. No. 6,036,872, issued Mar. 14, 2000, to R. A. Wood et al., and entitled "Method for Making a Wafer-Pair Having Sealed Chambers," which is hereby incorporated by reference in the present specification. The assignee of this patent document is the same assignee of the present invention. Still another patent document is U.S. Pat. No. 6,627,892 B2, issued Sep. 30, 2003, to B. Cole, and entitled "Infrared Detector Packaged with Improved Antireflection Element," which is hereby incorporated by reference in the present specification. The assignee of this patent document is the same assignee of the present invention.

SUMMARY

The present invention may have a substrate wafer with pixels and electronics, and a topcap wafer situated on and sealed to the substrate to form an integrated sealed package. The topcap may have an antireflective pattern formed on its interior surface proximate to the pixels. The topcap may have an inside volume around the perimeter of the pixels. Also, the topcap may have a sealable pumpout hole, vent or opening.

BRIEF DESCRIPTION OF THE DRAWINGS

FIGS. 2a and 2b show a cross-sectional view and top view of the topcap with an exterior bump filter;

FIGS. 3a and 3b a show a cross-sectional view and bottom view top view of the topcap with a perimeter seal;

FIGS. 7a and 7b show cross-sectional and top views of the assembled and sealed integrated vacuum package.

DESCRIPTION

The present invention may be a wafer having CMOS electronics and a topcap sealed to the wafer resulting in an integral vacuum package. A group of pixels may be situated on the wafer. Related art integral vacuum packages may have pumpout holes in the CMOS wafers for providing vacuum to the packages. Such location of the pumpout holes may result in severe yield losses relative to the expensive CMOS wafers. Further, the shapes of the topcaps of those other packages do not permit making anti-reflective surfaces on the interior of the topcaps to enhance pixel response. This is because the topcap has a shape with an interior surface what is a significant distance away from the pixels for a recess to permit for the dilution of components outgassed from the wafer package over time. The plane of the interior surface is also a significant distance from plane of the topcap seal. This configuration results in a shape of the interior surface that makes it impracticable if not impossible to provide the anti-reflective surface to the interior side of the topcap above the pixels. To avoid such impracticality, the present invention may change the recess from above the pixels to a perimeter volume around the group of pixels. Then the interior surface of the topcap may be near the pixels. This redesigned recess of the top may be used in conjunction with the pumpout holes or vents in the topcap wafer rather than the bottom pixel wafer. These changes may improve pixel performance and pixel or CMOS wafer yield.

Figure 1B:
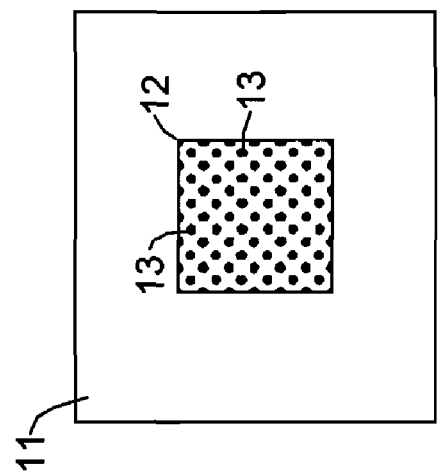
FIGS 1a and 1b show a cross-sectional view and bottom view of a topcap with an interior bump filter.
Figure 1A:
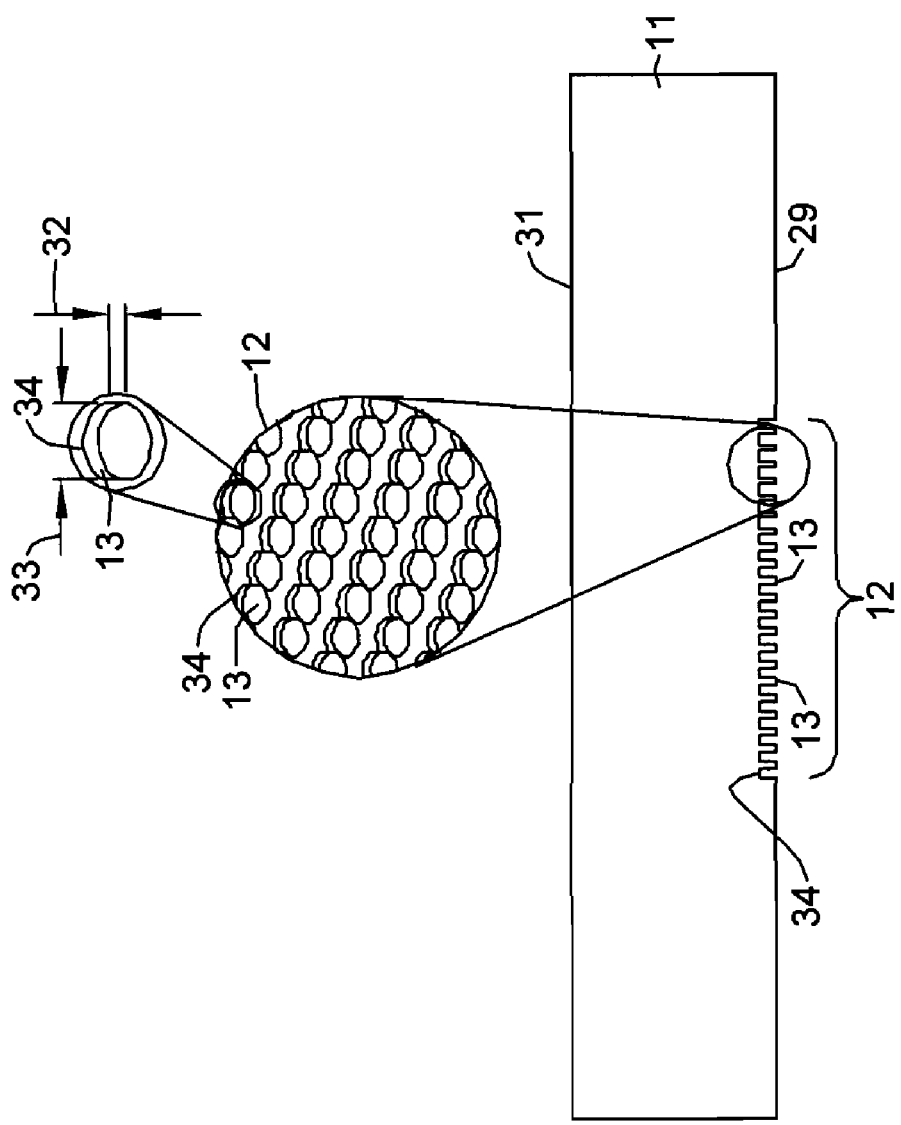

FIG. 1a shows a cross-section view of a topcap wafer 11. Wafer 11 is a float-zone wafer, i.e., having low oxygen content and being low-doped. The bottom or interior surface 29 of wafer 11 may have an antireflective surface 12. Surface 12 may be bumps 13 etched with a plasma etcher. A stepper may be needed for printing the bump patterns. Bumps 13 may be smaller than the wavelength of light that is to pass through wafer 11. The height or depth 32 of the bumps, posts or pedestals 13 may be approximately $\lambda/4$. The cross-dimensions or width 33 of the bumps, posts or pedestals 13 may be from $\lambda/10$ to $\lambda/5$. The indexes of refraction of bumps 13 and the places of space between the bumps (e.g., air or vacuum) may be averaged. This average index may be appropriate for attaining maximum anti-reflective (AR) properties of surface 12. A plan view of AR surface 12 is shown in FIG. 1b.

Interior cavity surface 29 of package cover or wafer 11 also may have an antireflection element, indicated generally at area 12, extending at least over an area above the detector pixel 21 array, and preferably over a greater area of cavity surface 29. Element 12 may be a field of upstanding posts 13 extending from a ground 34 in the level of surface 29. As an illustrative example, posts 13 may be shown as right circular cylinders, and are arranged in a rectangular matrix of rows and columns in the field of element 12. The dimensions and spacing (periodicity) of posts 13 may depends upon the refraction index of the window material and the wavelength band of the incident radiation desired to be detected. To approximate a quarter-wavelength antireflective layer 12, the height or depth 32 of posts 13 may be about $h=\lambda/(4n)$, where $\lambda$ is the approximate center of the wavelength band of interest, and n is the effective index of refraction of the field of element 12. Post height 32 may be typically in the range of 0.2 micron to 4 microns, corresponding to band centers from 3 to 60 microns. To avoid reflection at surface 29, it may be desirable to make $n=(n_w)^{1/2}$, where $n_w$ is the index of the solid window or wafer 11 material. Because posts 13 may be arranged in a pattern having symmetry in two orthogonal directions, n could be regarded as isotropic. The antireflective properties of the field of element 12 may be then the same for all polarizations of the incident radiation. The pattern could also have other shapes; for example, hexagonal posts 13 may permit higher packing density within the field of element 12.

In this illustrative example, the tops of posts 13 may be flush with interior surface 29 of the cavity, and their bottoms, the ground level 34, may lie beyond that surface into wafer 11. Alternatively, posts may be fabricated as holes extending below interior surface 29, having substantially the same cross-sectional area as posts 13. The term "posts" may be used here to denote both upstanding posts and depressed holes. The shapes of the posts (or holes) may be round, square, rectangular, or have any other convenient cross section. It may be also possible to fabricate posts (or holes) having a non-vertical sidewalls; that is, the posts can be shaped to provide a varying cross section along their height, such as substantially pyramidal or conical, including frustum and other variations of these shapes where the cross section decreases along the height of the posts (or, equivalently, depth of holes). Such posts offer enhanced antireflection performance over a wider range of wavelengths.

A desired effective index n of the field of element 12 may depend upon $n_w$ and upon the fill factor or relative area $A=A_p/A_f$ of the posts $A_p$ to the total field $A_f$. An approximate relationship for the effective index may be:

$$n=\{[(1-A+An_w^2)(A+(1-A)n_w^2)+n_w^2]/[2(A+(1-A)n_w^2)]\}^{1/2}$$

For round pillars of diameter d and center-to-center spacing s, $A=(\pi/4)(d/s)^2$. The relative areas of other shapes may be calculated. For silicon, the fill factor may range from about 20 percent to about 60 percent, being about 40 percent in this example. Post spacing or periodicity should be less than any wavelength in the desired band to avoid diffraction and scatter; for a rectangular array, this may be also the spacing between adjacent rows and columns. The lowest spacing may be determined by process limitations rather than by optical considerations. For a silicon cover 11 and a detector pixels 21 operating in the wave band of about 6-12 microns, square posts of side 1.5 microns may be spaced 2.3 microns apart.

An exterior anti-reflective bump pattern 14 may be etched on an opposite side 31 of wafer 11, as shown in FIGS. 2a and 2b. Bumps, posts or pedestals 13 of element 14 may have the same dimensions as those of element 12. Without elements 12 and 14, the transmitivity of wafer 11 may be only about 50 percent. With one of elements 12 and 14, the transmitivity of wafer 11 may be about 70 percent. With both elements 12 and 14, then the transmitivity of wafer 11 may be 90 percent or greater.

Figure 6:
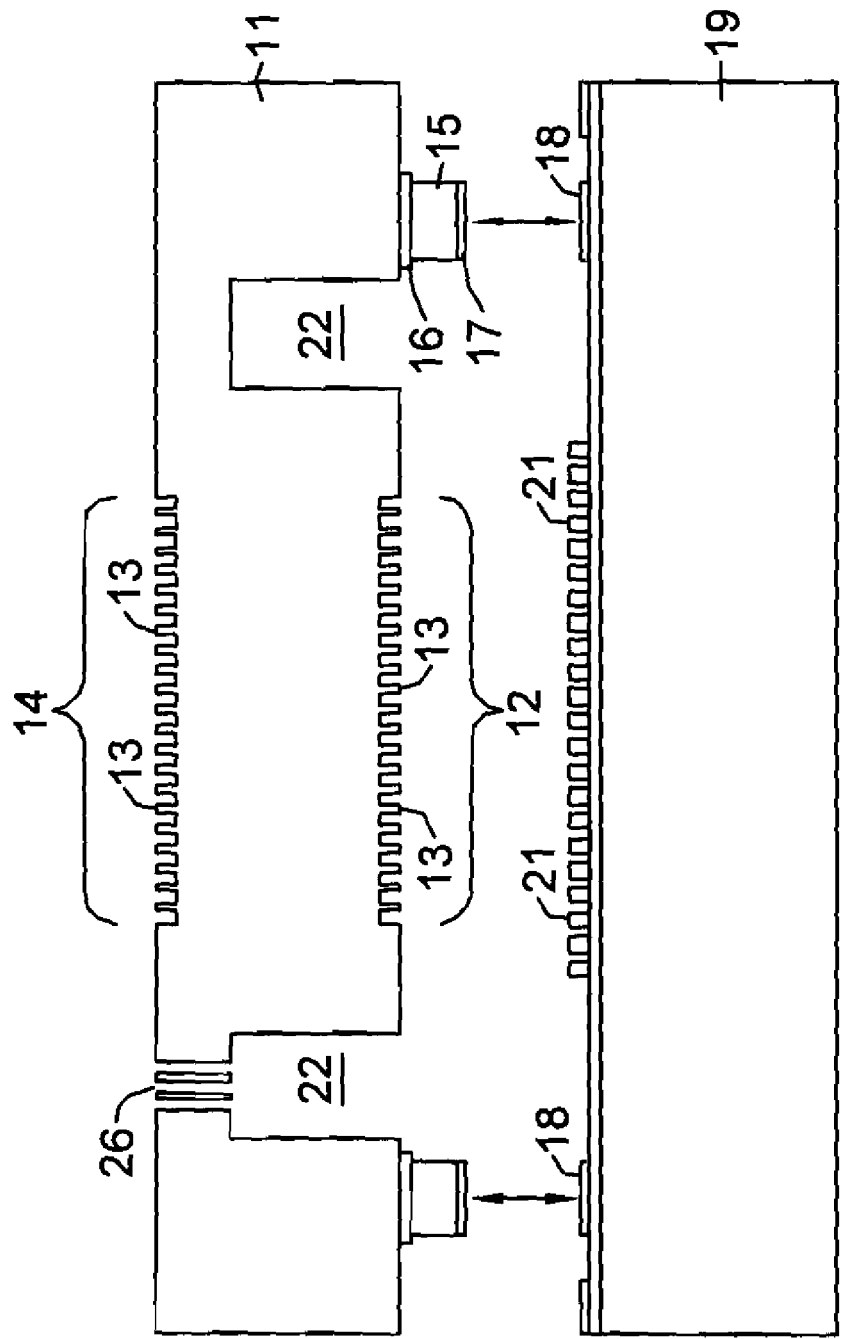
FIG. 6 shows a cross-sectional view of the topcap wafer and the bottom wafer of the package prior to sealing of the wafers.

In FIGS. 3a and 3b, there may be a spacer layer 15 and a malleable layer 17 that are patterned to match a seal ring 18 of a thin layer of gold on a detector wafer 19, as in FIG. 6. Ring 18 may be another material with the malleability and bonding qualities similar to gold. Layer 17 is for compensating for flatness differences between the two wafers being sealed to each other. About five microns of nickel may be used as spacer layer 15 to keep anti-reflective surface 12 and the remaining portion of lower surface 29 of wafer 11 within the perimeter of seal ring 18 from touching pixels 21 of detector wafer 19. Other material may be used for the spacer layer 15. There may be a bonding material 16 between metal 15 and wafer 11. Solder may be used for layer 17. It may be several microns thick so as to allow the seals of the wafers 11 and 19 to match up since both wafers might not have the same flatness relative to each other. Other materials in lieu of solder may be used for layer 17 of the seal.

Figure 4A:
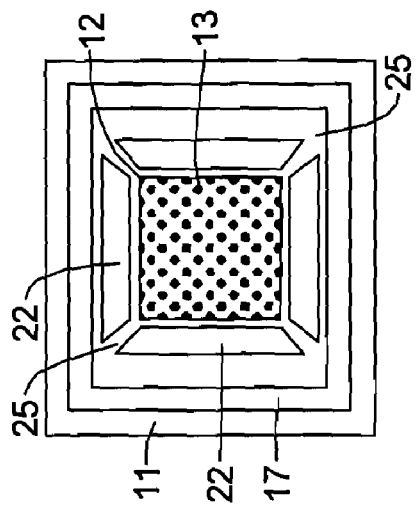
FIGS. 4a and 4b show cross-sectional view and bottom view of the topcap with interior recesses.
Figure 4B:
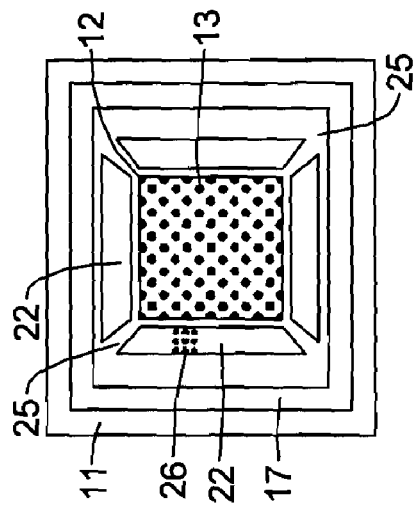

To provide volume within and between wafers 11 an 19, portions 22 may be etched away from wafer 11, as shown in FIGS. 4a and 4b. Wafer 11 may be about 500 microns thick at dimension 23. Portions 22 may be about 400 microns deep at dimension 24 leaving about 100 microns of wafer 11 at the top of portion or volume 22. Establishing volume 22 may involve one or more hour etch using a Bosch approach.

Volume 22 does not have to encircle the entire wafer 11. FIG. 4b shows a plan view of the bottom surface 29 of wafer 11 where volumes 22 are revealed. Portions or volumes 22 may be interrupted at the corners of wafer 11 with structural support portions 25. At those portions 25, portion or volume 22 is not etched and the thickness of wafer 11 may remain at about 500 microns. Thus, wafer 11 may provide volume 22 and yet maintain structural rigidity with portions 25. The deep recess, volume, trenches, or portions 22 may be etched by DRIE into the bottom side 29 of topcap wafer 11 to increase vacuum volume thereby making the device more tolerant of outgassing within the resulting sealed structure 27 occurring during its lifetime. Mechanical supports 25 may be present so that the middle region in the area of surface 12 does not appreciably deflect.

Figure 5A:
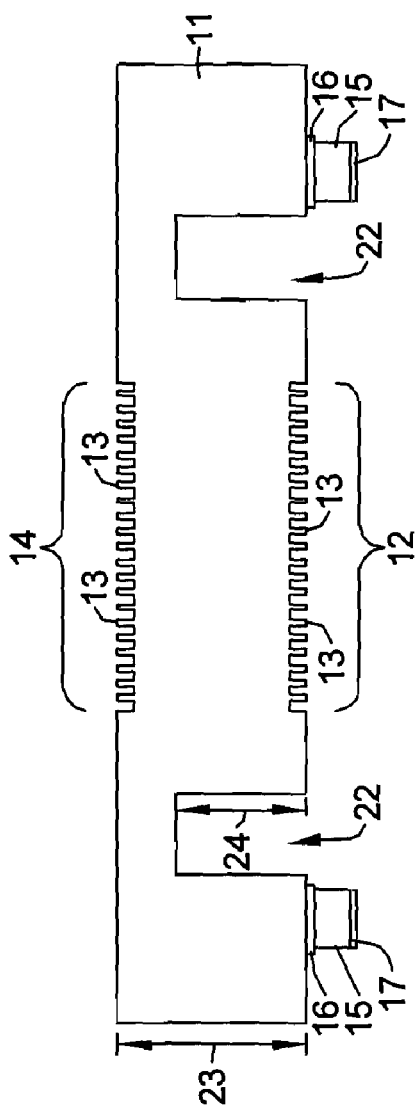
FIGS. 5a and 5b show a cross-sectional view and bottom view of the topcap with vent holes.
Figure 5B:
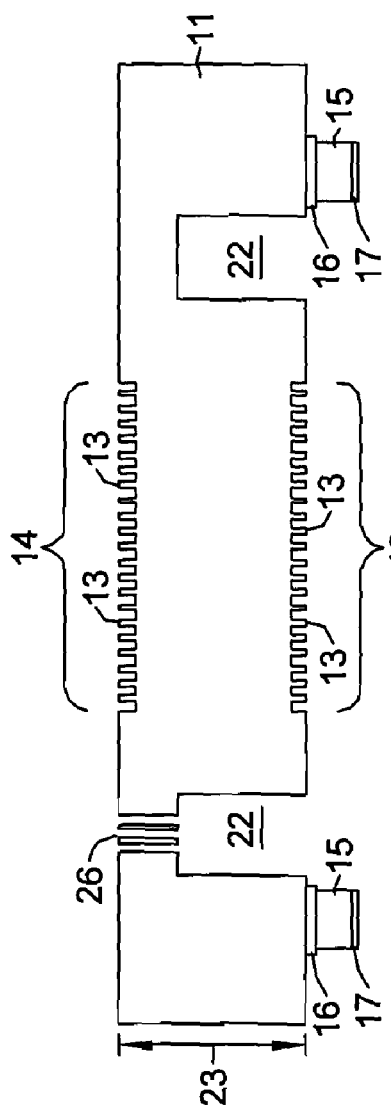

Small vent holes 26, which may regarded as pumpout ports, as shown in FIGS. 5a and 5b, may be etched from the top or exterior surface 31 of wafer 11. These ports, apertures, or holes 26 may provide for the final outgassing and sealing of structure 27 after wafers 11 and 19 are bonded to each other.

Topcap wafer 11 may be bonded to detector wafer 19 with heat at about 300 degrees C. for a period of time necessary to achieve a satisfactory bond, generally less than an hour. Then, bonded wafer pair 27 may be baked out to remove outgas from pair or structure 27. The temperature during bake-out may be around 250 degrees C. for about eight hours at a pressure of $10^{-6}$ Torr in a sealed vacuum environmental chamber. Holes 26 may be open during the bake-out. Then structure 27 may be left to cool down to room temperature for about 12 hours. In the meanwhile, the vacuum or pressure of the environment of structure 27 in the chamber may remain at about $10^{-6}$ Torr or less, such as $10^{-7}$ Torr. Then, while under this pressure after cool-down, small vacuum apertures, ports, holes 26 may be sealed or plugged with a deposited layer 28. The material of layer 28 may be indium or 50 percent ratio mix of indium and lead. The bonded and sealed integral topside vacuum package 27 is shown in cross-sectional and top views in FIGS. 7a and 7b, respectively.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. An integrated package comprising:
   a first wafer having a lower surface;
   a second wafer having an upper surface bonded at a first perimeter to the lower surface of the first wafer;
   a plurality of trenches formed in the lower surface of the first wafer in a second perimeter situated within the first perimeter;
   a first bump pattern on an upper surface of the first wafer; and
   a plurality of structural supports formed in the lower surface of the first wafer, the structural supports disposed between and separating the plurality of trenches.

2. The package of claim 1, further comprising a seal between the first and second wafers at the first perimeter.

3. The package of claim 2, further comprising at least one pumpout opening in the first wafer.

4. The package of claim 1, further comprising a second bump pattern on the lower surface of the first wafer.

5. The package of claim 1, wherein the first and second wafers comprise silicon.

6. The package of claim 1, further comprising at least one pumpout opening in the first wafer.

* * * * *